US009746501B1

(12) United States Patent
Chang (10) Patent No.: US 9,746,501 B1
(45) Date of Patent: Aug. 29, 2017

(54) APPARATUS FOR VOLTAGE DETECTION IN AN INTEGRATED CIRCUIT (71) Applicant: Microsemi Solutions (U.S.), Inc., Aliso Viejo, CA (US)

(72) Inventor: Howard Shih Hao Chang, Vancouver (CA)

(73) Assignee: Microsemi Solutions (U.S.), Inc., Aliso Viejo, CA (US)

( * ) Notice: Subject to any disclaimer, the term of this patent is extended or adjusted under 35 U.S.C. 154(b) by 353 days.

(21) Appl. No.: 14/500,766

(22) Filed: Sep. 29, 2014

(51) Int. Cl.
*H01L 27/085* (2006.01)
*G01R 19/00* (2006.01)
*H01L 27/092* (2006.01)

(52) U.S. Cl.
CPC ........ *G01R 19/0084* (2013.01); *H01L 27/092* (2013.01)

(58) Field of Classification Search
CPC .................................................. H01L 27/085
See application file for complete search history.

(56) References Cited

U.S. PATENT DOCUMENTS

| 3,454,793 A | 7/1969 | Davies et al. |
| 6,441,663 B1 | 8/2002 | Chuang et al. |
| 6,870,413 B1 * | 3/2005 | Chang ................. H03K 3/3565 327/205 |
| 7,167,032 B1 * | 1/2007 | Barlow ............... H03K 3/3565 327/205 |
| 8,446,204 B2 | 5/2013 | Srivastava et al. |
| 8,502,564 B2 * | 8/2013 | Mikan, Jr. ........... H03K 3/3565 326/104 |
| 2013/0027085 A1 | 1/2013 | Mikan, Jr. |

FOREIGN PATENT DOCUMENTS

EP             2587672 A2     5/2013

* cited by examiner

*Primary Examiner* — Hai L Nguyen
(74) *Attorney, Agent, or Firm* — Dennis R. Haszko (57) ABSTRACT A voltage detector to detect the voltage level of a switched power supply associated with a power gated region of an integrated circuit. The voltage detection circuit, which can be described as a modified Schmitt trigger circuit, comprises PMOS and NMOS transistors, and an added stack of NMOS transistors to set the output to a value of 1 in response to detection of an input voltage at the input greater than an operational voltage of the switched power supply, for example approximately 80% VDD and above. A pull-down circuit actively pulls the circuit output low before the circuit input drops below the low input threshold. Optional additional NMOS transistors provide the capability to adjust the threshold. The voltage detector circuit can be calibrated and used to detect whether or not the switched power supply associated with a power gated design has reached its operational voltage level.

20 Claims, 6 Drawing Sheets

APPARATUS FOR VOLTAGE DETECTION IN AN INTEGRATED CIRCUIT

FIELD

The present disclosure relates to integrated circuits, including but not limited to voltage detection in an integrated circuit using complementary metal oxide semiconductor (CMOS) technology.

BACKGROUND

Power gating is a widely used technique to reduce power in integrated circuits due to increasing leakage power in deep submicron technologies. Some integrated circuits include a power gated region, also referred to as a power gated digital place and route region. A power gated region is a region of cells to which a power supply is switched, for example to which power can be turned on and off. A power gated region can be described as a plurality of cells in an integrated circuit having a switched power supply. After power is restored to a power gated region, it is desirable to detect whether the voltage level of the switched power supply has reached an operational level.

Typical CMOS logic gates have relatively low input threshold voltages: their outputs will switch to VDD as soon as their inputs rise above about 1-200 mV (depending on the CMOS process and doping) above a negative supply voltage (VSS) or ground (GND). Therefore, such known typical CMOS logic gates are not suitable as voltage level detection circuits. In addition, the voltage level of a switched power supply rises relatively slowly which can induce crowbar currents, consuming unnecessary power and reducing reliability.

Improvements in voltage detection approaches, such as in an integrated circuits using CMOS technology, are desirable.

BRIEF DESCRIPTION OF THE DRAWINGS

Embodiments of the present disclosure will now be described, by way of example only, with reference to the attached Figures.

DETAILED DESCRIPTION

A voltage detector to detect the voltage level of a switched power supply associated with a power gated region of an integrated circuit. The voltage detection circuit, which can be described as a modified Schmitt trigger circuit, comprises PMOS and NMOS transistors, and an added stack of NMOS transistors to set the output to a value of 1 in response to detection of an input voltage at the input greater than an operational voltage of the switched power supply, for example approximately 80% VDD and above. A pull-down circuit actively pulls the circuit output low before the circuit input drops below the low input threshold. Optional additional NMOS transistors provide the capability to adjust the threshold. The output of the voltage detection circuit is high only when the circuit input rises above the high voltage threshold. The voltage detector circuit can be calibrated and used to detect whether or not the switched power supply associated with a power gated design has reached its operational voltage level.

Embodiments of the present disclosure relate to integrated circuits incorporating a power gated design. In a power gated design, a power gated region is a region of cells to which a power supply is switched, for example to which power can be turned on and off. A power gated circuit can be described as a plurality of cells in an integrated circuit having a switched power supply. A power-gated region is described as being "power-gated", or "power switched" because the power to that region is 'switched' (or gated). In the present disclosure, the term 'switched' is used interchangeably with the term 'gated'.

In an example embodiment, the present disclosure provides a voltage detection circuit comprising a modified CMOS Schmitt Trigger with a high programmable input threshold voltage and active pulldown.

In an embodiment, the present disclosure provides a voltage detection circuit for use with a power gated circuit, the voltage detection circuit having an input and an output. The voltage detection circuit comprises: a first PMOS transistor connected between the input and a positive supply voltage (VDD); a first NMOS transistor connected between a reset input pin (RN) and a negative supply voltage (VSS); second and third NMOS transistors connected together as a stack between the input and VDD; a stack of high voltage threshold incrementing NMOS transistors connected between the input and VDD and configured to set the output to a value of 1 in response to detection of an input voltage at the input greater than an operational voltage of the switched power supply; and a pull-down circuit configured to actively pull the voltage detection circuit output low before the circuit input drops below a low input threshold of the voltage detection circuit.

In an example embodiment, the voltage detection circuit further comprises a threshold adjustment circuit in communication with the stack of high voltage threshold incrementing NMOS transistors and configured to adjust a high voltage threshold of the voltage detection circuit, associated with the operational voltage of the switched power supply, by selectively enabling at least one transistor in the stack of high voltage threshold incrementing NMOS transistors.

In an example embodiment, the threshold adjustment circuit comprises a PMOS threshold control transistor connected between the stack of high voltage threshold incrementing NMOS transistors and a threshold voltage control input.

In an example embodiment, the threshold adjustment circuit is integral with the stack of high voltage threshold incrementing NMOS transistors.

In an example embodiment, the stack of high voltage threshold incrementing NMOS transistors comprises a plurality of pairs of high voltage threshold incrementing NMOS transistors; and the threshold adjustment circuit is configured to enable at least one pair of the plurality of pairs of high voltage threshold incrementing NMOS transistors using a threshold voltage control input, the threshold voltage control input being associated with the at least one pair of the plurality of pairs of high voltage threshold incrementing NMOS transistors.

In an example embodiment, the voltage detection circuit further comprises: a plurality of threshold adjustment circuits configured to adjust the high voltage threshold by selectively enabling at least one of the high voltage threshold incrementing NMOS transistors.

In an example embodiment, the stack of high voltage threshold incrementing NMOS transistors comprises a plurality of pairs of high voltage threshold incrementing NMOS transistors, and each of the plurality of threshold adjustment circuits is associated with, and configured to enable, a unique one of the plurality of pairs of high voltage threshold incrementing NMOS transistors using a threshold voltage control input, the threshold voltage control input being associated with the unique one of the plurality of pairs of high voltage threshold incrementing NMOS transistors.

In an example embodiment, the stack of high voltage threshold incrementing NMOS transistors comprises a plurality of pairs of high voltage threshold incrementing NMOS transistors, and each of the plurality of threshold adjustment circuits is associated with, and configured to enable, two of the plurality of pairs of high voltage threshold incrementing NMOS transistors using a threshold voltage control input, the threshold voltage control input being associated with the two of the plurality of pairs of high voltage threshold incrementing NMOS transistors.

In an example embodiment, the stack of high voltage threshold incrementing NMOS transistors comprises a plurality of sets of pairs of high voltage threshold incrementing NMOS transistors, and each of the plurality of threshold adjustment circuits is associated with, and configured to enable, a unique set of pairs of high voltage threshold incrementing NMOS transistors using a threshold voltage control input, the threshold voltage control input being associated with the unique set of pairs of high voltage threshold incrementing NMOS transistors.

In an example embodiment, the stack of high voltage threshold incrementing NMOS transistors is configured to set a high voltage threshold of the voltage detection circuit, associated with the operational voltage of the switched power supply, to a value of: at least 75% of VDD; at least 80% of VDD; at least 90% of VDD; about 90% of VDD; at least 95% of VDD; or about 98% of VDD.

In an example embodiment, the pull-down circuit comprises: a PMOS transistor connected between the reset input pin (RN) and VDD such that the output of the voltage detection circuit is pulled low in response to the reset input pin (RN) being enabled; and an inverter to correct the polarity of the output to the same polarity as the input, which in an example embodiment occurs substantially immediately after the reset input is enabled.

In an example embodiment, the PMOS transistor of the pull-down circuit is configured to pull the output of the voltage detection circuit inverter low substantially immediately after the reset input pin (RN) is enabled.

In another embodiment, the present disclosure provides a circuit, for example a voltage detection circuit, for use with a power gated circuit, the voltage detection circuit having an input and an output. The voltage detection circuit comprises: a stack of voltage threshold incrementing transistors comprising a plurality of pairs of NMOS transistors, the stack connected between the input and a positive supply voltage and configured to set the output to a value of 1 in response to detection of an input voltage at the input greater than an operational voltage of the switched power supply; a threshold adjustment circuit in communication with the stack of high voltage threshold incrementing NMOS transistors and configured to adjust a high voltage threshold of the voltage detection circuit, associated with the operational voltage of the switched power supply, by selectively enabling at least one transistor in the stack of high voltage threshold incrementing NMOS transistors; and a pull-down circuit configured to actively pull the voltage detection circuit output low before the circuit input drops below a low input threshold of the voltage detection circuit.

In a further embodiment, the present disclosure provides a sensor, for example a voltage sensor, for use with a power gated circuit of an integrated circuit, the power gated circuit having a switched power supply. The voltage sensor comprises: a switched power mesh configured to enable switching of power to the power gated circuit, the switched power mesh having an input and an output; a voltage detection circuit having an input in communication with the output of the switched power mesh, the voltage detection circuit having an input and an output, and comprising a stack of voltage threshold incrementing transistors comprising a plurality of pairs of NMOS transistors, the stack connected between the input of the voltage detection circuit and a positive supply voltage and configured to set the output of the voltage detection circuit to a value of 1 in response to detection of an input voltage at the input of the voltage detection circuit greater than an operational voltage of the switched power supply; a threshold adjustment circuit in communication with the stack of high voltage threshold incrementing NMOS transistors and configured to adjust a high voltage threshold of the voltage detection circuit, associated with the operational voltage of the switched power supply, by selectively enabling at least one transistor in the stack of high voltage threshold incrementing NMOS transistors, the threshold adjustment circuit including a plurality of threshold control input pins; a plurality of configuration registers in communication with threshold control input pins to provide threshold control inputs to the threshold adjustment circuit; and a pull-down circuit configured to actively pull the voltage detection circuit output low before the circuit input drops below a low input threshold of the voltage detection circuit.

In another embodiment, the present disclosure provides a circuit, for example a voltage detection circuit, for use with a power gated circuit, the voltage detection circuit having an input and an output. The voltage detection circuit comprises: a stack of voltage threshold incrementing transistors comprising a plurality of pairs of NMOS transistors, the stack connected between the input and a positive supply voltage and configured to set the output to a value of 1 in response to detection of an input voltage at the input greater than an operational voltage of the switched power supply; and a pull-down circuit configured to actively pull the voltage detection circuit output low before the circuit input drops below a low input threshold of the voltage detection circuit.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

In a power gated digital design, a detection circuit is required to determine whether or not a switched power supply has reached its operational voltage level. In a preferred implementation, the circuit is small, low power, and can be easily integrated with the rest of the digital circuits. Very high accuracy is not required because it would be too costly in terms of area and power. High precision is required to ensure repeatability of results.

Figure 1:
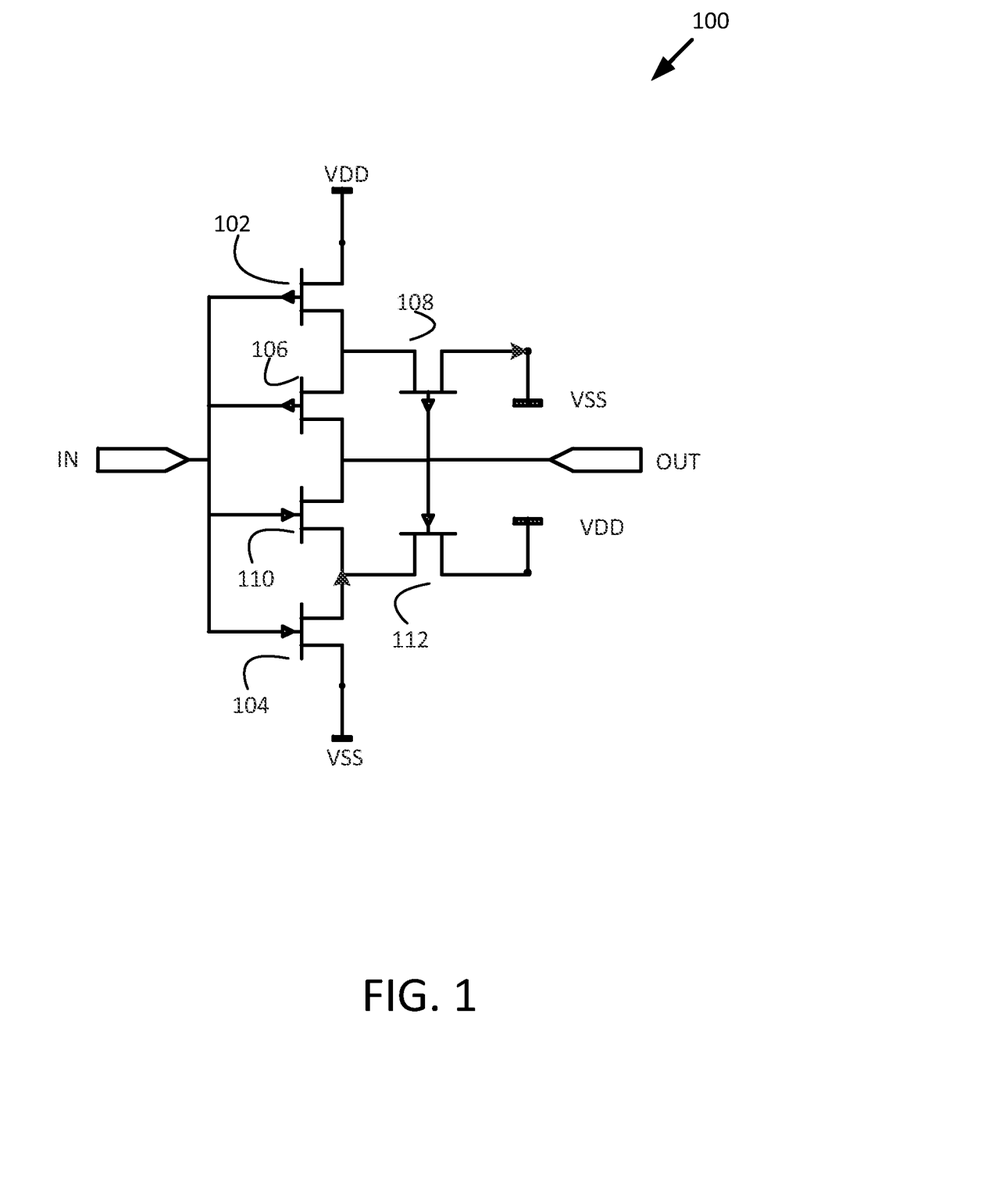
FIG. 1 illustrates a conventional Schmitt trigger circuit.

FIG. 1 illustrates a conventional Schmitt trigger circuit 100 having an input and output. The Schmitt trigger circuit of FIG. 1 consists of three PMOS and three NMOS transistors. A first PMOS transistor 102 is connected between the input and a positive supply voltage VDD. A first NMOS transistor 104 is connected between the input and ground, also referred to as a negative supply voltage or VSS. Second and third PMOS transistors 106 and 108 are connected together as a stack between the input and VSS, and affect a low input threshold, or low voltage detection threshold, for the circuit 100. Second and third NMOS transistors 110 and 112 are connected together as a stack between the input and VDD, and affect a high input threshold, or high voltage detection threshold, for the circuit 100.

Although a Schmitt trigger 100 may be used to detect a certain voltage level, the Schmitt Trigger high voltage detection threshold is relatively low in comparison to the desired threshold for implementations of interest. For example, the input threshold voltage of the circuit of FIG. 1 is about 50% of VDD, which is too low for performing voltage detection for a switched power supply after power is restored thereto.

When turning on power in a power gated region, a VDD rail requires sufficient time to reach an operational voltage level of the power gated region. It is difficult to determine, however, how much time is required or when the VDD rail reaches the correct voltage. The correct voltage may be at least 75% of VDD, may be about 80% of VDD, may be about 90% of VDD, and may be greater than 95% of maximum. The exact operational voltage is process dependent and the allowable drop from nominal voltage is design target dependent.

Figure 2:
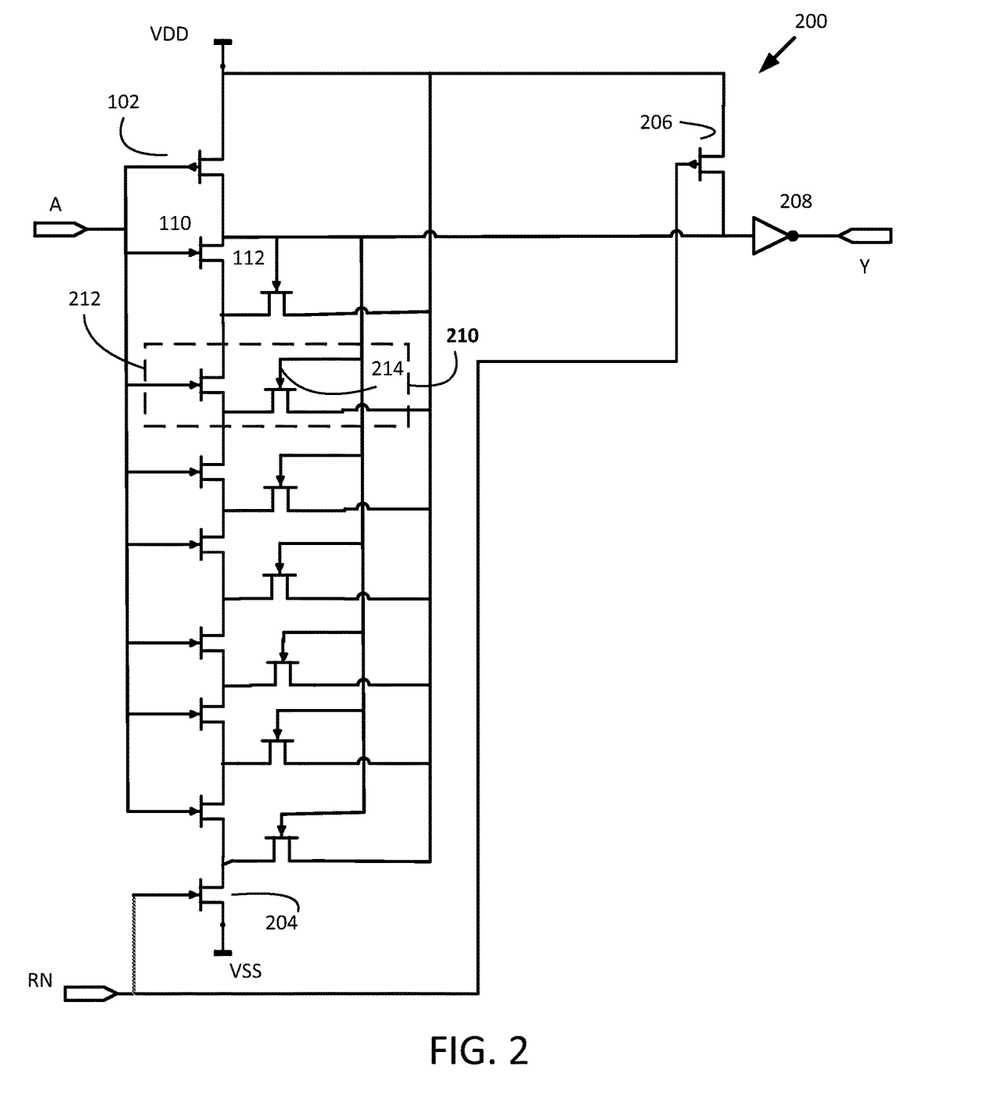
FIG. 2 illustrates a voltage detection circuit according to an embodiment of the present disclosure.

FIG. 2 illustrates a voltage detection circuit 200 according to an embodiment of the present disclosure for use with a switched power supply. As illustrated in FIG. 2, the main input to the circuit 200 is labelled 'A', and the main output of the circuit 200 is labelled 'Y'. FIG. 2 can be described as a modified Schmitt trigger with a raised high input threshold according to an embodiment of the present disclosure. The circuit 200 includes a first PMOS transistor 102 connected between the input and a positive supply voltage VDD, and second and third NMOS transistors 110 and 112, similar to FIG. 1. While the first NMOS transistor 104 in FIG. 1 is connected between the input and VSS, the first NMOS transistor 204 of FIG. 2 is connected between the reset input pin (RN) and ground, also referred to as a negative supply voltage or VSS.

In an embodiment, the circuit 200 comprises a pull-down circuit configured to actively pull the voltage detection circuit output low before the circuit input drops below the low input threshold of the circuit 200 and the related prior art Schmitt trigger. In an example embodiment as shown in FIG. 2, the pull-down circuit includes a PMOS transistor 206 connected between the reset input pin (RN) and VDD and an inverter 208. When the reset input pin (RN) is enabled, the output of the circuit 200 is pulled low, which in an example embodiment occurs substantially immediately after the reset input is enabled.

The inverter 208 before the 'Y' output is provided to correct the polarity of the output signal to the same polarity as the input signal. While the circuit 200 is an analog circuit, in a digital sense when the input 'A' is 1, the output 'Y' is 1, with the inclusion of the inverter 208; when 'A' is 0, 'Y' is 0 (when sufficient time is allowed to stabilize).

The voltage detection circuit 200 has a high input voltage threshold (Vih) and a low input voltage threshold (Vil). The high input voltage threshold (Vih) of the voltage detection circuit 200 is increased by adding one or more stacks of NMOS transistors. The PMOS transistors 104 and 106 connecting to VSS in FIG. 1 are removed in the modified Schmitt trigger of FIG. 2 because a low value of Vil is desired.

The voltage detection circuit 200 of FIG. 2 comprises a stack 210 of NMOS transistors connected between the input and VDD and configured to set the output to a value of 1 in response to detection of an input voltage at the input greater than an operational voltage of the switched power supply. In an implementation, this sets a high voltage threshold of the voltage detection circuit to a value corresponding to an operational voltage of the switched power supply. In the example embodiment of FIG. 2, the amount by which the high input threshold is raised is fixed, and is dependent on the number of stacked NMOS transistors that are added. In an embodiment, the stack 210 of NMOS transistors includes a pair of stacked NMOS transistors 212 and 214 connected between the input and VDD.

Each of the NMOS transistors 212 and 214 has a gate and first and second terminals. In an example embodiment: the gate of the NMOS transistor 212 is connected to the input A; the first terminal of the NMOS transistor 212 is connected to the second terminal of the transistor 110; the second terminal of the NMOS transistor 212 is connected to the first terminal of the NMOS transistor 214; the gate of the NMOS transistor 214 is connected to the output Y; and the first terminal of the NMOS transistor 214 is connected to VDD.

In an example embodiment, the stack 210 of NMOS transistors includes a plurality of pairs of stacked NMOS transistors connected between the input and VDD. In a further embodiment, the circuit 200 comprises a plurality of stacks 210 of NMOS transistors, each stack comprising a pair of stacked NMOS transistors.

Figure 3:
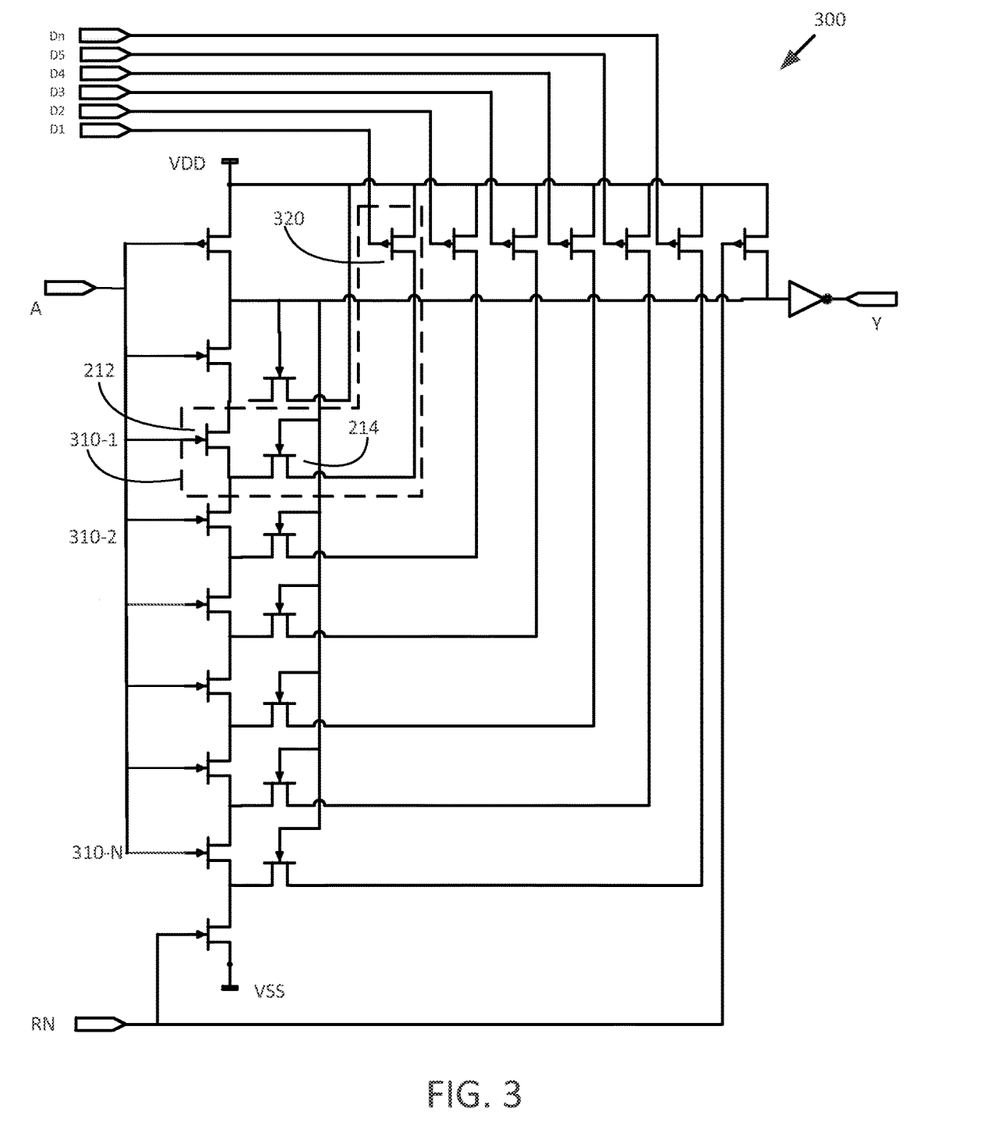
FIG. 3 illustrates a voltage detection circuit with an adjustable threshold according to an embodiment of the present disclosure.

FIG. 3 illustrates a voltage detection circuit 300 with an adjustable threshold according to an embodiment of the present disclosure for use with a switched power supply. In an embodiment, the circuit 300 comprises a threshold adjustment circuit configured to adjust the high input threshold of the circuit by selectively enabling or disabling at least one stack of NMOS transistors in the circuit. In an example embodiment, the threshold adjustment circuit, or threshold adjustment controller, comprises a PMOS threshold control transistor 320 connected between a stack 310-1, 310-2, . . . , 310-N of NMOS transistors and a threshold voltage control input. In the example embodiment of FIG. 3, input threshold controllability is added by inserting the PMOS threshold control transistor 320 into the VDD path of each added stack of NMOS transistors. In an example embodiment, the threshold adjustment circuit, or threshold adjustment controller, comprises the PMOS threshold control transistor 320 connected between the pair of stacked NMOS transistors 212 and 214 and a threshold voltage control input.

In an example embodiment, the gate of the PMOS threshold control transistor 320 is connected to a threshold voltage control input D1, D2, etc. A first terminal of the PMOS threshold control transistor 320 is connected to a terminal of one of the stacked NMOS transistors. A second terminal of the PMOS threshold control transistor 320 is connected to VDD. In an embodiment, the stack of NMOS transistors 310-1, . . . , 310-N includes the threshold adjustment circuit.

In the example embodiment as shown in FIG. 3, the circuit 300 comprises a plurality of threshold adjustment controllers. Each of the plurality of threshold adjustment controllers is associated with, and configured to control or enable/disable, a unique corresponding stack 310-1, . . . , 310-N of NMOS transistors. For example, the threshold voltage control input D1 is an input to the threshold adjustment controller that includes the PMOS threshold control transistor 320, which controls the stack 310-1 of NMOS transistors. Similar associations apply to the other threshold voltage control inputs, until the threshold voltage control input DN is provided as an input to the threshold adjustment controller that includes a PMOS threshold control transistor, which controls the stack 310-N of NMOS transistors.

Figure 4:
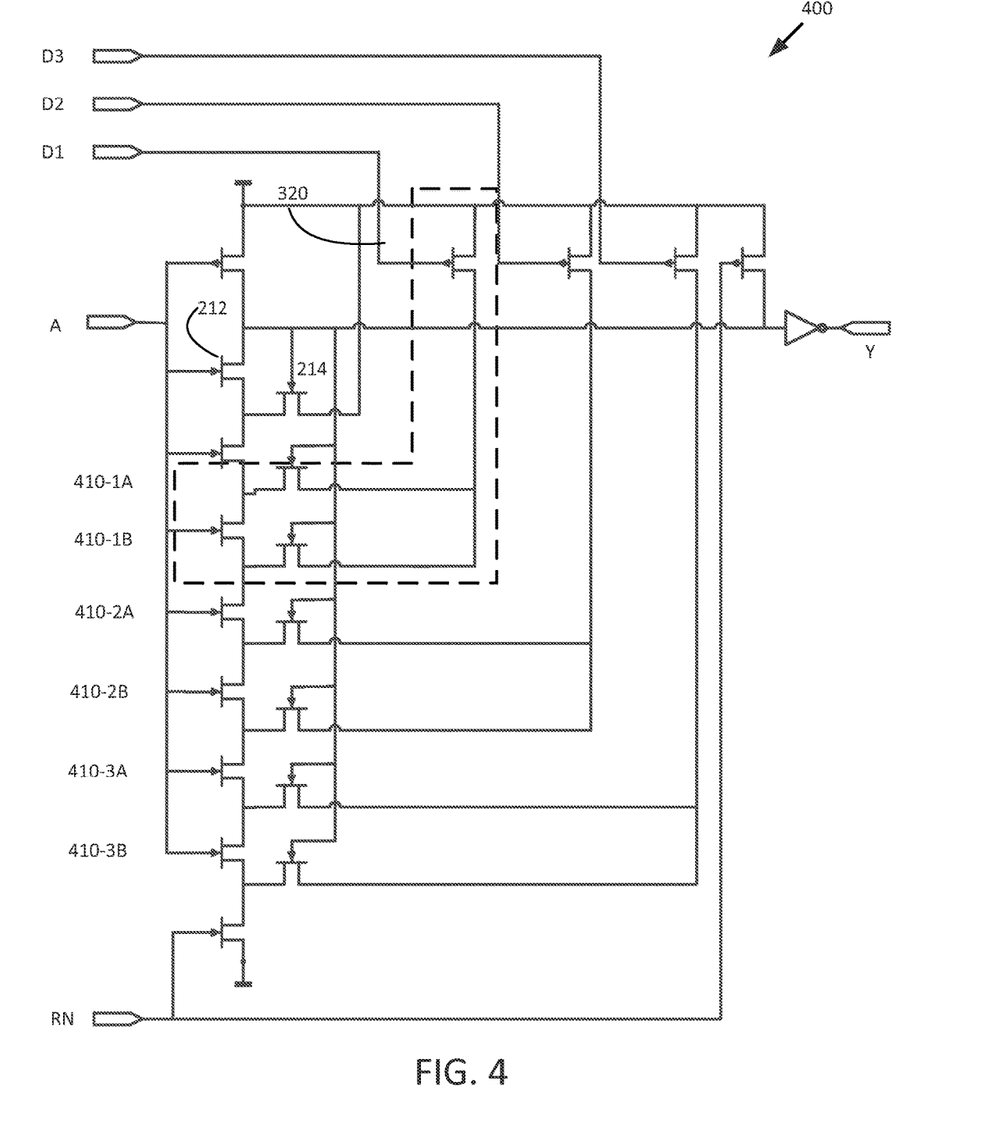
FIG. 4 illustrates a voltage detection circuit with an adjustable threshold according to another embodiment of the present disclosure.

FIG. 4 illustrates a voltage detection circuit 400 with an adjustable threshold having a reduced resolution according to another embodiment of the present disclosure and for use with a switched power supply. In FIG. 3, each NMOS-PMOS pair for threshold adjustment has a corresponding input D1, D2, etc. In FIG. 4, each D input controls two pairs of NMOS/PMOS transistors for threshold adjustment. For example, the threshold voltage control input D1 is an input to the threshold adjustment controller that includes the PMOS threshold control transistor 320, which controls the stacks 410-1A and 410-1B of NMOS transistors.

Alternatively, FIG. 4 can be described as a voltage detection circuit 400 including a stack of voltage threshold incrementing transistors comprising a plurality of pairs 410-1A, 410-1B of NMOS transistors, the stack connected between the input and a positive supply voltage (VDD). Similarly, another stack of voltage threshold incrementing transistors comprises a plurality of pairs 410-2A, 410-2B of NMOS transistors.

In another embodiment, the circuit 400 comprises a plurality of threshold adjustment controllers, each of the plurality of threshold adjustment controllers being associated with, and configured to control or enable/disable, a plurality of corresponding stacks of NMOS transistors.

Generally speaking, an input D is provided to control part of the group of transistors that increases and fine tunes the high input threshold. FIG. 2 shows the increase at a fixed amount, with the amount of increase being based on the number of NMOS transistors added. FIGS. 3 and 4 show adjustable increase based on activation of input(s).

According to an example embodiment of the present disclosure, the following table lists a high input threshold simulation performed in a 28 nm CMOS process. The results for each of the calibration input combinations (D3, D2, D1) are written as the voltage level below VDD. For example, if VDD is 0.9V, −10 mV means output 'Y' switches to VDD when input 'A' rise above 0.890V.

TABLE 1

High Input Voltage Threshold Simulation

| | {D3, D2, D1}* | | | |
|---|---|---|---|---|
| PVT Corner | 000 | 001 | 011 | 111 |
| SS, 0° C. | −1 mV | −5 mV | −14 mV | −116 mV |
| SS, 25° C. | −4 mV | −9 mV | −20 mV | −120 mV |
| SS, 125° C. | −10 mV | −29 mV | −52 mV | −182 mV |
| FF, 0° C. | −10 mV | −15 mV | −40 mV | −164 mV |
| FF, 125° C. | −13 mV | −27 mV | −66 mV | −200 mV |
| FS, 0° C. | −11 mV | −20 mV | −30 mV | −152 mV |
| FS, 125° C. | −20 mV | −33 mV | −77 mV | −218 mV |
| SF, 0° C. | −7 mV | −12 mV | −33 mV | −123 mV |
| SF, 125° C. | −14 mV | −12 mV | −52 mV | −170 mV |
| TT, 0° C. | −9 mV | −15 mV | −25 mV | −138 mV |
| TT, 125° C. | −9 mV | −29 mV | −60 mV | −193 mV |

*Calibrate control signals D3-D1 use thermometer coding.

In Table 1 above, which refers to the simplified circuit of FIG. 4, the values indicate a higher input threshold when all of the input signals D1, D2 and D3 are set to 0. With each input signal that is set to 1, the threshold value decreases, with a significant decrease when all three signals are set to 1. When the input is set to 0, the connection goes straight to VDD, which is similar to the embodiment in FIG. 1 in which the increase is fixed. When the input is set to 1, this pulls the signal away from VDD to the input D0, D1, etc., making it as if the NMOS stack is not connected, and the high input threshold is unchanged or not increased.

Embodiments of the present disclosure provide a method for detecting whether a VDD rail has reached operational voltage using new voltage detector comprising a modified Schmitt Trigger including interconnected transistors. The input voltage from the VDD rail is applied to the gates of transistors connected in series by their drains and sources. The voltage from the drain and source of the first and second transistor in the series, respectively, is inverted and output. If the output is 1, VDD has reached the desired voltage level.

In an example embodiment, the voltage from the drain and source of the first and second transistor, respectively, is also applied to the gates of other transistors. The drain of each of these other transistors is connected to a unique drain-source pair of the series of transistors. The gates of these other transistors are controlled by data inputs which select or program the VDD operational threshold voltage required to cause a 1 to be generated at the output. The threshold could, for example, be set to 98% of the maximum VDD level depending on what data inputs are selected. The inputs also allow for adapting to different chip temperatures and process corners. The Schmitt trigger also comprises a reset input pin (RN) that, when enabled, can immediately pull the output of the circuit low.

Figure 5:
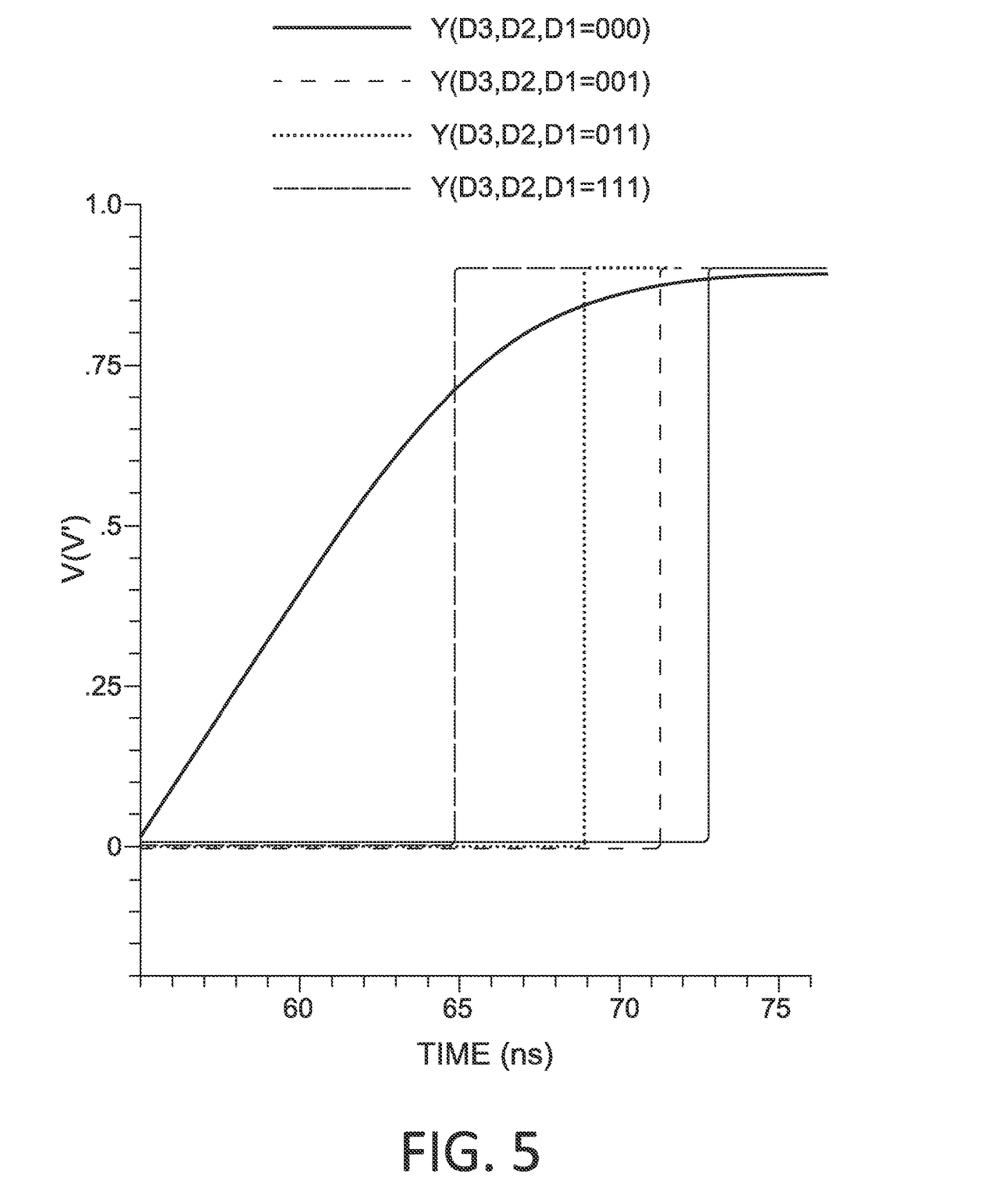
FIG. 5 is a graph illustrating input and output voltage levels of a voltage detection circuit according to an embodiment of the present disclosure, across four different settings of calibration threshold voltage control inputs.

FIG. 5 is a graph 500 illustrating input and output voltage levels of a voltage detection circuit according to an embodiment of the present disclosure, across four different settings of calibration threshold voltage control inputs. The graph of FIG. 5 illustrates a simulation waveform of input 'A' and output 'Y' voltage level, across four different settings of D3, D2, D1 calibration threshold voltage control inputs. FIG. 5 shows the simulation waveform of Table 1, which is based on FIG. 4. FIG. 4 is a simplified version of FIG. 3 with reduced granularity, which provides an advantage of reduced pin count when higher granularity is not needed.

Figure 6:
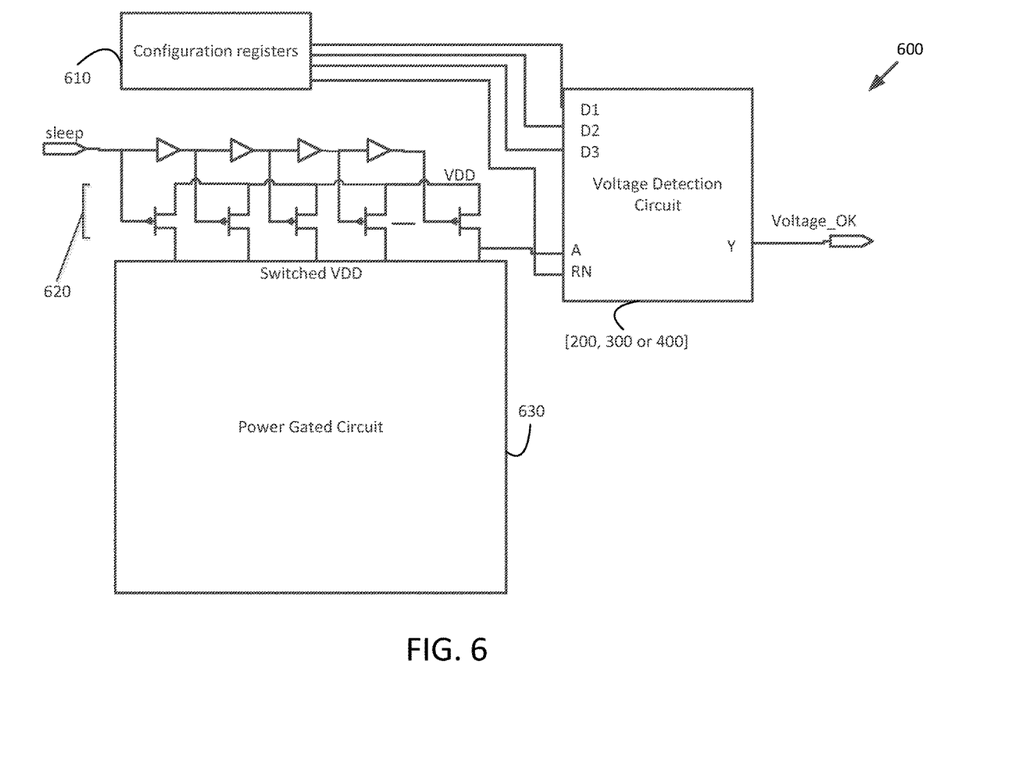
FIG. 6 is a block diagram illustrating an application as a voltage sensor of a modified Schmitt trigger according to an embodiment of the present disclosure.

FIG. 6 is a block diagram 600 illustrating an application as a voltage sensor of a voltage detection circuit 200, 300 or 400 according to an embodiment of the present disclosure. When using the arrangement of FIG. 6 in a power gated design, the threshold voltage control inputs D3,D2,D1 are connected to configuration registers 610. The desired setting is dependent on the process corner of the particular device. The input A is connected to a switched VDD power mesh 620. The switched VDD power mesh 620 is a circuit that enables the switching of power to a power gated circuit 630. The output Y is connected to a Voltage_OK signal. When power is restored to the power gated circuit, or power gated region, 630, the input 'RN' is toggled from 0 to 1. Once the switched VDD rises above the voltage threshold listed in Table 1, 'Voltage_OK' becomes a logic "1" and the power gated block can be safely operated.

The handling of the Voltage_OK signal is outside of the scope of the embodiments of the present disclosure. The details of how to use the Voltage_OK signal would be dependent on the implementation and on design choices. For example, a circuit somewhere on the device can turn on a power gated region and wait for Voltage_OK to become '1'; when Voltage_OK is '1', the circuit would subsequently reset the region, turn on the clock, and start pushing data through it (i.e., use it).

Power gating is a widely practiced technique in very large scale integrated circuit (VLSI) devices. Embodiments of the present disclosure provide a very cost effective method of detecting a voltage level of a switched power supply.

Embodiments of the present disclosure provide a modified Schmitt trigger with programmable input threshold and active pull down. The number of stacked transistors and number of threshold voltage control inputs in the examples described herein are intended to be illustrative only. According to other embodiments of the present disclosure, a different number of stacked transistors, a different number of threshold voltage control inputs, or both, are provided, where the exact number can be varied based on the associated requirements, and to adjust the desired characteristics.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A voltage detection circuit for use with a power gated circuit, the voltage detection circuit having an input and an output, and comprising:
   a first PMOS transistor connected between the input and a positive supply voltage (VDD);
   a first NMOS transistor connected between a reset input pin (RN) and a negative supply voltage (VSS);
   second and third NMOS transistors connected together as a stack between the input and VDD;
   a stack of high voltage threshold incrementing NMOS transistors connected between the input and VDD and configured to set the output to a value of 1 in response to detection of an input voltage at the input greater than an operational voltage of the switched power supply; and
   a pull-down circuit configured to actively pull the voltage detection circuit output low before the circuit input drops below a low input threshold of the voltage detection circuit.

2. The voltage detection circuit of claim 1 further comprising:
   a threshold adjustment circuit in communication with the stack of high voltage threshold incrementing NMOS transistors and configured to adjust a high voltage threshold of the voltage detection circuit, associated with the operational voltage of the switched power supply, by selectively enabling at least one transistor in the stack of high voltage threshold incrementing NMOS transistors.

3. The voltage detection circuit of claim 2 wherein the threshold adjustment circuit comprises a PMOS threshold control transistor connected between the stack of high voltage threshold incrementing NMOS transistors and a threshold voltage control input.

4. The voltage detection circuit of claim 2 wherein the threshold adjustment circuit is integral with the stack of high voltage threshold incrementing NMOS transistors.

5. The voltage detection circuit of claim 2 wherein:
   the stack of high voltage threshold incrementing NMOS transistors comprises a plurality of pairs of high voltage threshold incrementing NMOS transistors; and
   the threshold adjustment circuit is configured to enable at least one pair of the plurality of pairs of high voltage threshold incrementing NMOS transistors using a threshold voltage control input, the threshold voltage control input being associated with the at least one pair of the plurality of pairs of high voltage threshold incrementing NMOS transistors.

6. The voltage detection circuit of claim 1 further comprising:
   a plurality of threshold adjustment circuits configured to adjust the high voltage threshold by selectively enabling at least one of the high voltage threshold incrementing NMOS transistors.

7. The voltage detection circuit of claim 6 wherein:
   the stack of high voltage threshold incrementing NMOS transistors comprises a plurality of pairs of high voltage threshold incrementing NMOS transistors, and
   each of the plurality of threshold adjustment circuits is associated with, and configured to enable, a unique one of the plurality of pairs of high voltage threshold incrementing NMOS transistors using a threshold voltage control input, the threshold voltage control input being associated with the unique one of the plurality of pairs of high voltage threshold incrementing NMOS transistors.

8. The voltage detection circuit of claim 6 wherein:
the stack of high voltage threshold incrementing NMOS transistors comprises a plurality of pairs of high voltage threshold incrementing NMOS transistors, and
each of the plurality of threshold adjustment circuits is associated with, and configured to enable, two of the plurality of pairs of high voltage threshold incrementing NMOS transistors using a threshold voltage control input, the threshold voltage control input being associated with the two of the plurality of pairs of high voltage threshold incrementing NMOS transistors.

9. The voltage detection circuit of claim 6 wherein:
the stack of high voltage threshold incrementing NMOS transistors comprises a plurality of sets of pairs of high voltage threshold incrementing NMOS transistors, and
each of the plurality of threshold adjustment circuits is associated with, and configured to enable, a unique set of pairs of high voltage threshold incrementing NMOS transistors using a threshold voltage control input, the threshold voltage control input being associated with the unique set of pairs of high voltage threshold incrementing NMOS transistors.

10. The voltage detection circuit of claim 1 wherein the stack of high voltage threshold incrementing NMOS transistors is configured to set a high voltage threshold of the voltage detection circuit, associated with the operational voltage of the switched power supply, to a value of at least 75% of VDD.

11. The voltage detection circuit of claim 1 wherein the stack of high voltage threshold incrementing NMOS transistors is configured to set a high voltage threshold of the voltage detection circuit, associated with the operational voltage of the switched power supply, to a value of at least 80% of VDD.

12. The voltage detection circuit of claim 1 wherein the stack of high voltage threshold incrementing NMOS transistors is configured to set a high voltage threshold of the voltage detection circuit, associated with the operational voltage of the switched power supply, to a value of at least 90% of VDD.

13. The voltage detection circuit of claim 1 wherein the stack of high voltage threshold incrementing NMOS transistors is configured to set a high voltage threshold of the voltage detection circuit, associated with the operational voltage of the switched power supply, to a value of about 90% of VDD.

14. The voltage detection circuit of claim 1 wherein the stack of high voltage threshold incrementing NMOS transistors is configured to set a high voltage threshold of the voltage detection circuit, associated with the operational voltage of the switched power supply, to a value of at least 95% of VDD.

15. The voltage detection circuit of claim 1 wherein the stack of high voltage threshold incrementing NMOS transistors is configured to a high voltage threshold of the voltage detection circuit, associated with the operational voltage of the switched power supply, to a value of about 98% of VDD.

16. The voltage detection circuit of claim 1 wherein the pull-down circuit comprises:
a PMOS transistor connected between the reset input pin (RN) and VDD such that the output of the voltage detection circuit is pulled low in response to the reset input pin (RN) being enabled; and
an inverter to correct the polarity of the output to the same polarity as the input, which in an example embodiment occurs substantially immediately after the reset input is enabled.

17. The voltage detection circuit of claim 15 wherein the PMOS transistor of the pull-down circuit is configured to pull the output of the voltage detection circuit inverter low substantially immediately after the reset input pin (RN) is enabled.

18. A voltage detection circuit for use with a power gated circuit, the voltage detection circuit having an input and an output, and comprising:
a stack of voltage threshold incrementing transistors comprising a plurality of pairs of NMOS transistors, the stack connected between the input and a positive supply voltage and configured to set the output to a value of 1 in response to detection of an input voltage at the input greater than an operational voltage of the switched power supply;
a threshold adjustment circuit in communication with the stack of high voltage threshold incrementing NMOS transistors and configured to adjust a high voltage threshold of the voltage detection circuit, associated with the operational voltage of the switched power supply, by selectively enabling at least one transistor in the stack of high voltage threshold incrementing NMOS transistors; and
a pull-down circuit configured to actively pull the voltage detection circuit output low before the circuit input drops below a low input threshold of the voltage detection circuit.

19. A voltage sensor for use with a power gated circuit of an integrated circuit, the power gated circuit having a switched power supply, the voltage sensor comprising:
a switched power mesh configured to enable switching of power to the power gated circuit, the switched power mesh having an input and an output;
a voltage detection circuit having an input in communication with the output of the switched power mesh, the voltage detection circuit having an input and an output, and comprising a stack of voltage threshold incrementing transistors comprising a plurality of pairs of NMOS transistors, the stack connected between the input of the voltage detection circuit and a positive supply voltage and configured to set the output of the voltage detection circuit to a value of 1 in response to detection of an input voltage at the input of the voltage detection circuit greater than an operational voltage of the switched power supply;
a threshold adjustment circuit in communication with the stack of high voltage threshold incrementing NMOS transistors and configured to adjust a high voltage threshold of the voltage detection circuit, associated with the operational voltage of the switched power supply, by selectively enabling at least one transistor in the stack of high voltage threshold incrementing NMOS transistors, the threshold adjustment circuit including a plurality of threshold control input pins;
a plurality of configuration registers in communication with threshold control input pins to provide threshold control inputs to the threshold adjustment circuit; and
a pull-down circuit configured to actively pull the voltage detection circuit output low before the circuit input drops below a low input threshold of the voltage detection circuit.

20. A voltage detection circuit for use with a power gated circuit, the voltage detection circuit having an input and an output, and comprising:
- a stack of voltage threshold incrementing transistors comprising a plurality of pairs of NMOS transistors, the stack connected between the input and a positive supply voltage and configured to set the output to a value of 1 in response to detection of an input voltage at the input greater than an operational voltage of the switched power supply; and
- a pull-down circuit configured to actively pull the voltage detection circuit output low before the circuit input drops below a low input threshold of the voltage detection circuit.

* * * * *